United States Patent
Masuoka

(10) Patent No.: US 6,551,884 B2
(45) Date of Patent: Apr. 22, 2003

(54) SEMICONDUCTOR DEVICE INCLUDING GATE INSULATION FILMS HAVING DIFFERENT THICKNESSES

(75) Inventor: Sadaaki Masuoka, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/140,929

(22) Filed: May 9, 2002

(65) Prior Publication Data

US 2002/0173066 A1 Nov. 21, 2002

(30) Foreign Application Priority Data

May 15, 2001 (JP) ........................................ 2001-144605

(51) Int. Cl.[7] ............................................ H01L 1/8234
(52) U.S. Cl. ........................................ 438/275; 438/279
(58) Field of Search ................................. 438/199, 216, 438/238, 770, 275–279, 775, 981

(56) References Cited

U.S. PATENT DOCUMENTS

| | | | | |
|---|---|---|---|---|
| 6,133,164 A | * | 10/2000 | Kim | 438/275 |
| 6,191,049 B1 | * | 2/2001 | Song | 438/758 |
| 6,225,167 B1 | * | 5/2001 | Yu et al. | 438/275 |
| 6,258,673 B1 | * | 7/2001 | Houlihan et al. | 438/199 |
| 6,303,521 B1 | * | 10/2001 | Jeng | 438/770 |
| 6,410,387 B1 | * | 6/2002 | Cappelletti et al. | 438/257 |
| 6,417,037 B1 | * | 7/2002 | Feng | 438/216 |
| 2002/0039824 A1 | * | 4/2002 | Tsuji | 438/268 |

FOREIGN PATENT DOCUMENTS

JP  2000-195969  7/2000

* cited by examiner

Primary Examiner—Phat X. Cao
Assistant Examiner—Thao X. Le
(74) Attorney, Agent, or Firm—McGinn & Gibb, PLLC

(57) ABSTRACT

A method for forming three gate oxide films having different thicknesses in first through third circuit areas, respectively. The method includes the consecutive steps of forming a first gate oxide film having a largest thickness in all the areas, removing the first gate oxide film and forming a second gate oxide film having a second largest thickness in the second circuit area, and removing the first gate oxide and forming a third gate oxide film having a smallest thickness in the third circuit area. The resultant gate oxide films have accurate thicknesses.

12 Claims, 4 Drawing Sheets

SEMICONDUCTOR DEVICE INCLUDING GATE INSULATION FILMS HAVING DIFFERENT THICKNESSES

BACKGROUND OF THE INVENTION (a) Field of the Invention

The present invention relates to a semiconductor device including gate insulation films having different thicknesses. The present invention also relates to a method for forming such a semiconductor device.

(b) Description of the Related Art

Along with the developments of finer patterning and high-speed operation of semiconductor devices, a multi-functional semiconductor device, such as a system LSI, formed on a single semiconductor substrate is increasingly used for a variety of applications. In the system LSIs, a finer patterning technology using a STI (shallow trench isolation) structure is generally used. On the other hand, some techniques for the system LSIs use a fabrication process for forming gate insulation films having different film thicknesses for adapting the gate insulation films to different functions of the system LSIs.

In a typical STI structure, a problem of the step portion in the STI, known as a STI step problem, is known. The STI step is formed as detailed below. In general, a silicon oxide film formed within the shallow trench is subjected to an undesired etching during the etchings performed in the respective areas isolated by the shallow trench. The undesired etching generally causes a depression at the edge of the shallow trench, which forms the STI step. Once the STI step is formed at the edge portion of the isolation trench, the MOSFETs separated by the shallow trench suffer from an increase in the off-leakage current, whereby transistor characteristics are degraded. Patent Publication JP-A2000-195969 describes a technique for preventing the degradation of the transistor characteristics by forming MOSFETs including gate insulation films having different thicknesses on a single substrate. FIGS. 1A to 1K show the consecutive steps of fabrication of such gate insulation films.

On a silicon (semiconductor) substrate 20, a silicon oxide film 21 is formed by a thermal oxidation technique, followed by deposition of a silicon nitride film 22 thereon, as shown in FIG. 1A, by using a CVD technique. On the silicon nitride film 22, a photoresist pattern (not shown) is formed, which has openings on the area for forming the shallow trench, by using a photolithographic technique. The silicon nitride film 22 is then subjected to patterning by anisotropic etching using the photoresist pattern as an etching mask, as shown in FIG. 1B. By using the thus patterned silicon nitride film 22 as an etching mask, the silicon oxide film 21 and the top portion of the silicon substrate 20 are selectively etched to form a shallow trench or isolation trench 23 having a depth of 100 to 500 nanometers (nm), as shown in FIG. 1C. The depth of the shallow trench 23 depends on the types of the circuit to be formed on the silicon substrate 20.

Subsequently, a silicon oxide film 24 having a thickness of around 300 to 1000 nm is deposited on the silicon nitride film 22 and within the shallow trench 23 by using a low-pressure CVD (LPCVD) technique. A CMP (chemical-mechanical polishing) process is then performed on the wafer by using the silicon nitride film 22 as a stopper, to remove a portion of the silicon oxide film 24 above the silicon nitride film 22, thereby leaving the lower portion of the silicon oxide film 24 within the shallow trench 23. Thereafter, the silicon nitride film 22 is removed by wet etching using hot phosphoric acid, as shown in FIG. 1D.

Subsequently, a silicon oxide film 25 having a thickness of around 3 to 15 nm is formed on the surface portion of the silicon substrate 20 by using a thermal oxidation technique, as shown in FIG. 1E. Then, an ion implantation process is conducted for selectively implanting impurity ions such as boron or boron fluoride into an nMOS area, wherein nMOS-FETs are to be formed, by using a mask, separately from an ion implantation process for implanting impurity ions such as phosphorous or arsenic into a pMOS area, wherein pMOSFETs are to be formed, by using another mask. Thus, well regions (not shown) are formed in the respective areas of the silicon substrate 20.

Thereafter, a silicon nitride film 26 is formed on the silicon oxide film 25, followed by forming a photoresist pattern 30 having an opening on a memory cell array area 29 among the whole areas including an logic circuit area 27, a sense amplifier area 28 and the memory cell array area 29, the memory cell array area 29 generally including MOSFETs having a larger thickness for the gate oxide films. The silicon nitride film 26 exposed from the opening of the photoresist pattern 30 is removed by etching, as shown in FIG. 1F. Further, ion-implantation is conducted for implanting impurity ions such as boron or boron fluoride through the opening of the photoresist pattern 30 while passing the thin silicon oxide film 25, thereby forming channel regions of memory cells in the memory cell array area 29.

The photoresist pattern 30 is then removed, followed by forming another photoresist pattern 31 having an opening on the sense amplifier area 28. The sense amplifier area 28 includes MOSFETs which have a gate insulation film having a thickness similar to the thickness of the gate insulation film of the MOSFETs in the memory cell area 29, and a threshold voltage different from the threshold voltage of the MOSFETs in the memory cell area 29. By using the photoresist pattern 31 as a mask, the silicon nitride film 26 in the sense amplifier area 28 is selectively removed, followed by implantation of impurity ions such as boron through the opening of the photoresist pattern 31 and the thin silicon oxide film 25, to form channel regions of the MOSFETs in the sense amplifier area 28, as shown in FIG. 1G.

The photoresist pattern 31 is then removed, followed by wet etching using the silicon nitride film 26 as a mask and hydrofluoric acid as an etchant, to remove the silicon oxide film 25 in the sense amplifier area 28 and the memory cell array area 29, which may be called herein thick-film areas. Another silicon oxide film 32 having a larger thickness than the silicon oxide film 25 in the logic circuit area 27 is then formed as a gate insulating film in the sense amplifier area 28 and the memory cell array area 29 by using an oxidation process, as shown in FIG. 1H. As shown in FIG. 1H, the silicon oxide film 25 and the silicon nitride film 26 are formed on the logic circuit area 27, which may be called herein a thin-film area, whereas the silicon oxide film 32 is formed on the thick-film areas 28 and 29.

By using hot phosphoric acid as an etchant, the silicon nitride film 26 is removed in the logic circuit area 27, followed by forming another photoresist pattern 33 covering the active areas of the pMOSFETs in the thin-film area 27 and the thick-film areas 28 and 29. By using the another photoresist pattern 33 as a mask, impurity ions such as boron or boron fluoride are implanted into the active areas of the nMOSFETs in the logic circuit area 27 to form channel regions in the nMOSFETs in the logic circuit area 27. Similarly, by covering the active areas of the nMOSFETs in the thin-film area 27 and the thick-film areas 28 and 29, impurity ions are implanted to the active areas of the pMOSFETs in the logic circuit area 27, to form channel regions of the pMOSFETs therein. Thereafter, the silicon oxide film 25 in the logic circuit area 27 is removed, as shown in FIG. 11, followed by removal of the another photoresist pattern 33.

A silicon oxide film 34 having a thickness of about 4 to 7 nm is then formed as a gate insulating film in the logic circuit area 27 by thermal oxidation, as shown in FIG. 1J. In this step, the silicon oxide film 34 is also formed on the preceding silicon oxide film 32 in the thick-film areas, or the sense amplifier area 28 and the memory cell array area 29, whereby all the channel regions and the gate insulating films are formed in the entire areas 27, 28 and 29.

Subsequently, in the case of nMOSFETs, a polysilicon film including impurity ions such as boron or boron fluoride at about $1\times10^{21}/cm_3$ and having a thickness of about 50 to 100 nm is deposited by a CVD technique, followed by deposition of a metal silicide film such as a tungsten silicide film thereon by using a CVD or sputtering technique, and patterning thereof in combination with the polysilicon film to form a gate electrode 35. Further, ion-implantation is performed to implant phosphorous or arsenic into the nMOS area and boron or boron fluoride into the pMOS area at a dosage of about $3\times10^{13}/cm^2$ and an acceleration energy of about 20 to 40 keV, thereby forming source/drain regions, as shown in FIG. 1K. Thereafter, a LPCVD step is conducted to form an interlayer insulation film having a thickness of about 200 to 600 nm, followed by forming an interconnect pattern thereon.

The conventional technique as described above is directed to forming gate insulating films having two different thicknesses. It is recited in the publication that, by equalizing the numbers and the conditions of the removal steps for the silicon oxide films between the areas for which the thickness of the silicon oxide film is different, it is possible to prevent the in-trench silicon oxide film formed beforehand in the shallow trench from being excessively or differently etched, whereby the edge of the shallow trench has a uniform topology without a STI step.

Along with the development of higher functions for the semiconductor devices, it is desired to form gate insulating films having three or more different thicknesses in a single semiconductor device. More particularly, in a technique for fabrication of a system LSI, for example, it is desired to form different thicknesses of the gate insulating films for high-voltage MOSFETs in an I/O area, high-speed MOSFETs in a high-speed logic circuit area, and low-leakage current MOSFETs in a standby logic circuit area. In other word, it is desired to develop the technique for manufacturing MOSFETs having three or more different thicknesses for gate insulating films while assuring low-leakage current and excellent transistor characteristics for the MOSFETs.

In the technique described in the above publication, it is not recited to manufacture MOSFETs having three or more different thicknesses of the gate insulating films although it is recited to manufacture MOSFETs having two different thicknesses of the gate insulating films.

In addition, in the technique described in the above publication, the silicon oxide film 25 formed in common to the thick-film areas 28 and 29 and the thin-film area 27 is eventually removed, and instead, the silicon oxide films 32 and 34 are formed in the thick-film areas 28 and 29 whereas the silicon oxide film 34 is formed in the thin-film area 27. This necessitates removal of the silicon oxide films twice for the fabrication of MOSFETs having two different thicknesses of the gate insulating films.

Moreover, in the technique described in the above publication, a thin gate insulating film is formed in the thick-film areas 28 and 29, and then another thin gate insulating film is formed in the thin-film area 27. During the step for forming the thin gate insulating film in the thin-film area 27, the thin gate insulating films in the thick-film areas 28 and 29 are concurrently oxidized to form a thick gate insulating film. In such a process, however, the process conditions for forming the thin gate insulating film in the thin-film area 27 are inevitably limited by the process conditions for obtaining the final thickness of the thick gate insulating films in the thick-film areas 28 and 29. The process conditions used for forming the gate insulating films in the later or last step are thus complicated depending on the number of different thicknesses of the gate insulating films in a single LSI.

SUMMARY OF THE INVENTION

In view of the above, it is an object of the present invention to provide a semiconductor device having three or more different thicknesses of silicon oxide films in desired areas substantially without involving an increase in the gate-leakage current and an off-leakage current of the MOSFETs formed in the MOS areas.

It is another object of the present invention to provide a method for manufacturing such a semiconductor device.

The present invention provides, in a first aspect thereof, a method for fabricating a semiconductor device having thermal silicon oxide films having n different thicknesses, given n being an integer not smaller than three, the method including the steps of:

forming an isolation trench receiving therein an in-trench oxide film on a semiconductor substrate to separate an area of the semiconductor substrate into first through n-th circuit areas:

forming a first thermal oxide film having a largest thickness among the n different thicknesses in the first through n-th circuit areas; and iterating, consecutively for i=2 to i=n, removing the first thermal oxide film in the i-th circuit area and forming an i-th thermal oxide film having an i-th largest thicknesses among the n different thickness in the i-th circuit area.

The present invention also provides, in a second aspect thereof, a method for fabricating a semiconductor device including gate oxide films having n different thicknesses, given n being an integer not smaller than three, the method including the steps of:

forming an isolation trench on a semiconductor substrate to separate an area of the semiconductor substrate into first through n-th circuit areas:

filling the trench with a filling member so that the filling member has a top surface higher than a top surface of the semiconductor substrate;

forming a first gate oxide film having a largest thickness among the n different thicknesses in the first through n-th circuit areas; and iterating, consecutively for i=2 to i=n, removing the first gate oxide film in the i-th circuit area and forming an i-th gate oxide film having an i-th largest thickness among the n different thicknesses in the i-th circuit area.

The present invention also provides, in a third aspect thereof, a semiconductor device including:

a semiconductor substrate;

an isolation trench receiving therein an in-trench silicon oxide film and separating an area of the semiconductor substrate into first through n-th circuit areas; and first through n-th thermal silicon oxide films formed in the first through n-th circuit areas, respectively, the first through n-th thermal silicon oxide films having first through n-th largest thicknesses, respectively, the in-trench silicon oxide film having a top surface higher than a top surface of the semiconductor substrate in the first circuit area, the in-trench silicon oxide film having a top surface substantially flush with the top surface of the semiconductor substrate in the second through n-th circuit areas.

The present invention also provides, in a fourth aspect thereof, a semiconductor device including:

a semiconductor substrate;

an isolation trench filled with a filling member and separating an area of the semiconductor substrate into first through n-th circuit areas; and first through n-th gate insulating films formed in the first through n-th circuit areas, respectively, the gate insulating films having first through n-th largest thicknesses, respectively, the filling member having a top surface higher than a top surface of the semiconductor substrate in the first circuit area, the filling member having a top surface substantially flush with the top surface of the semiconductor substrate in the second through n-th circuit areas.

In accordance with the method of the present invention and the method for manufacturing the semiconductor device of the present invention, by consecutively forming silicon thermal oxide films so that the thermal oxide film having a largest thickness among the thicknesses of the remaining films, the process alleviates the influence on the thicknesses of the previous thermal oxide films by the later thermal oxidation, the previous thermal oxide films being formed by previous thermal oxidation steps. This allows the thermal oxide films in the resultant semiconductor device to have more accurate thicknesses.

In the method of the present invention, the circuit area is not limited to a specific area, and may be typically a MOS area wherein at least one MOSFET or at least a pair of MOSFETs is formed. In the MOS area, the thermal oxide films are gate insulating films or gate oxide films of the MOSFETs.

In the method of the present invention, since the thickness of the gate insulating film is varied depending on the desired characteristics of the MOSFET, the MOSFETs formed by the method are adapted to the variety of applications. The circuit area recited in the semiconductor device of the present invention may be a MOS area wherein at least one MOSFET or at least a pair of MOSFETs are formed, or a specific circuit area wherein a circuit having a specific function or at least one circuit element having a specific function is formed.

In the present invention, the term "gate insulating film" may be typically a silicon oxide film, but not limited thereto, and may be a silicon oxide nitride film instead.

The first through n-th thermal oxide films in the present invention are typically gate insulating films; however, the thermal oxide films are not limited thereto. The in-trench oxide film may be replaced by another filling member such as a layer structure including a silicon oxide film, a silicon nitride film and a silicon oxide film.

PREFERRED EMBODIMENTS OF THE INVENTION

Figure 1A:
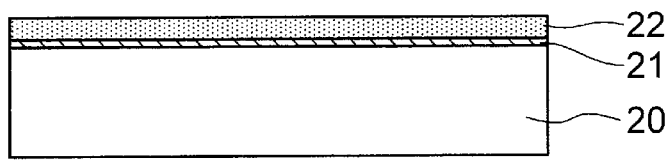
FIGS. 1A to 1K show consecutive steps of a conventional fabrication process of gate insulation films in a semiconductor device.
Figure 1B:
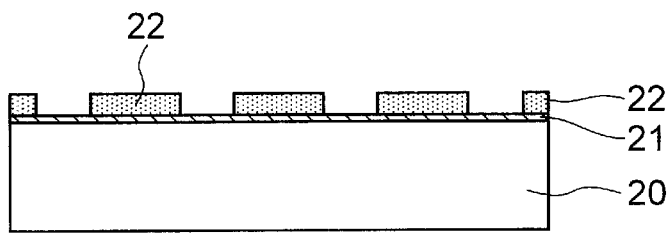
Figure 1C:
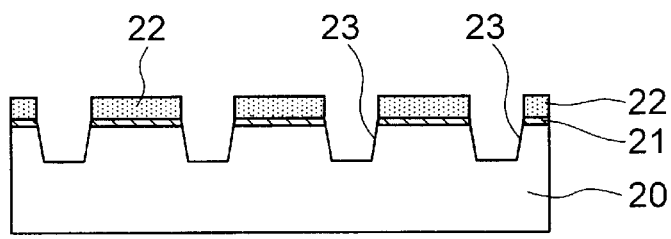
Figure 1D:
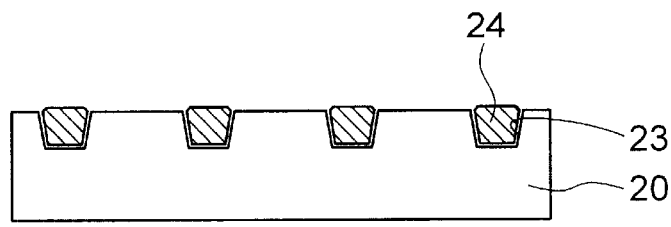
Figure 1E:
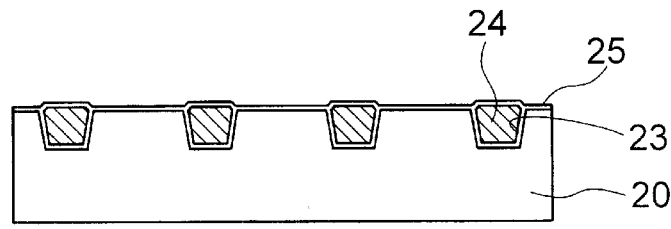
Figure 1F:
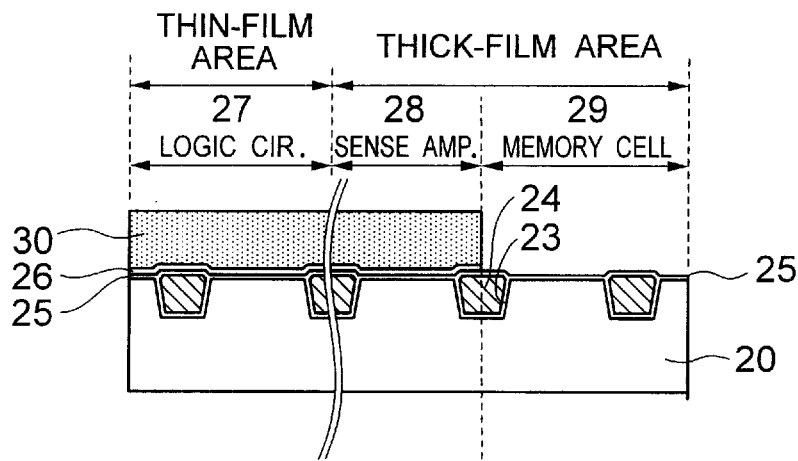
Figure 1G:
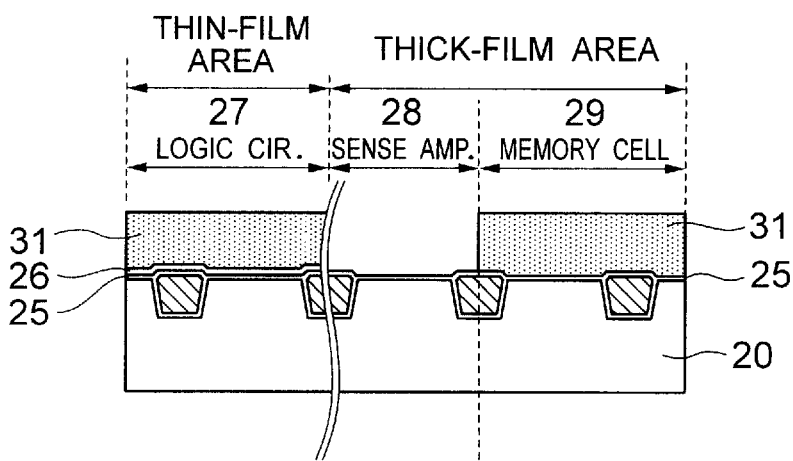
Figure 1H:
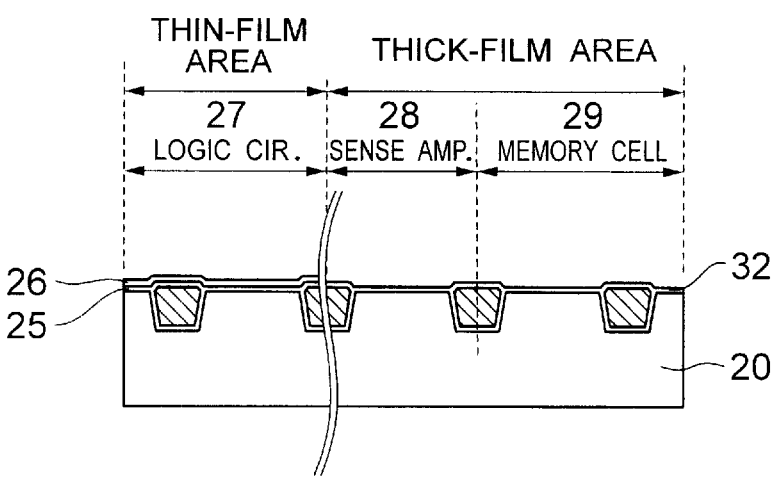
Figure 1I:
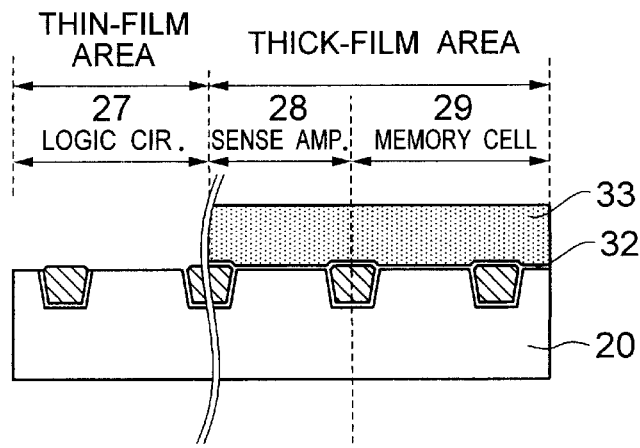
Figure 1J:
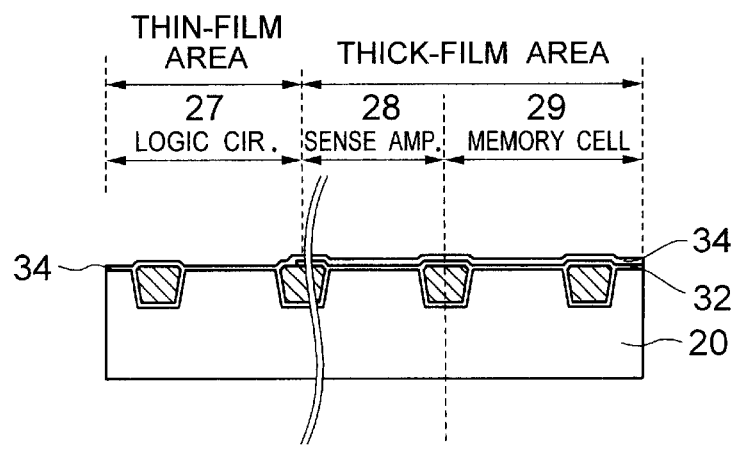

Now, the present invention is more specifically described with reference to accompanying drawings. Referring to FIGS. 2A to 2E, there are shown consecutive steps of a process, according to an embodiment of the present invention, for manufacturing a semiconductor device including an I/O MOS area 60, a low-leakage MOS area 70 and a high-speed MOS area 80. The I/O MOS area 60 includes I/O MOSFETs having a 75-angstrom-thick gate oxide film, the low-leakage MOS area 70 includes low-leakage MOSFETs having a 26-angstrom-thick gate oxide film, and the high-speed MOS area 80 includes high-speed MOSFETs having a 19-angstrom-thick gate oxide film.

The process of the present embodiment includes initial steps similar to the steps shown in FIGS. 1A to 1D, wherein a shallow trench 11 including an in-trench silicon oxide film 12 is formed on a silicon (semiconductor) substrate 10 to separate the area of the silicon substrate 10 into three MOS areas 60, 70 and 80 each including a large number of transistor regions. It is to be noted that the in-trench silicon oxide film 12 formed in the shallow trench 11 has a top surface slightly higher than the top surface of the silicon substrate 10 in the three MOS areas 60, 70 and 80.

Figure 2A:
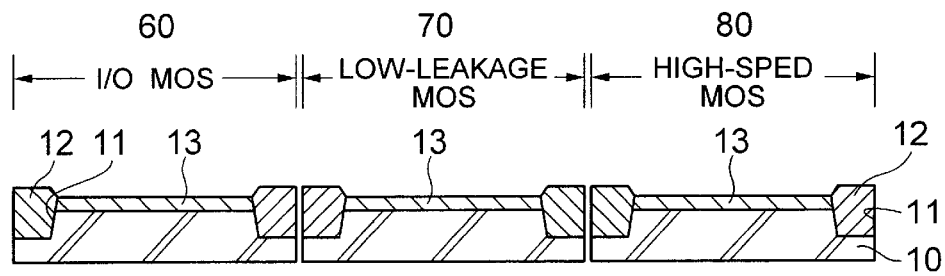
FIGS. 2A to 2E, show consecutive steps of a fabrication process of gate insulation films in a semiconductor device, according to an embodiment of the present invention.
Figure 2B:
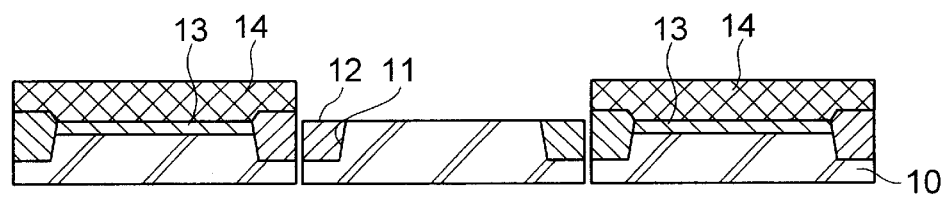

Subsequently, a 75-angstrom-thick first gate oxide film 13 is formed in the three areas 60, 70 and 80 by a first thermal oxidation step, as shown in FIG. 2A. Thereafter, a photoresist mask 14 is formed to cover the I/O MOS area 60 and the high-speed MOS area 80, followed by first wet etching to remove the first gate oxide film 13 in the low-leakage MOS area 70, as shown in FIG. 2B. In this stage, the silicon oxide film 12 in the shallow trench 11 is slightly etched so that the top surface of the in-trench silicon oxide film 12 becomes substantially flush with the top surface of the silicon substrate 10.

Figure 2C:
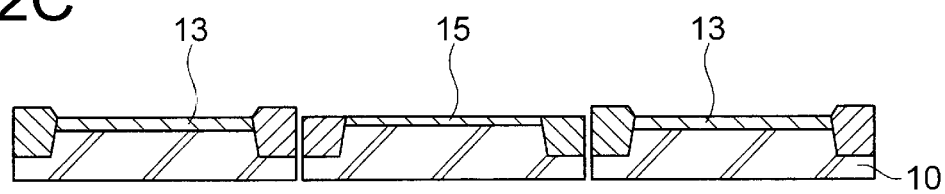

After removing the photoresist mask 14, second oxidation is performed to form a 26-angstrom-thick second gate oxide film 15 in the low-leakage MOS area 70, as shown in FIG. 2C. At this stage, although the thickness of the first gate oxide film 13 slightly increases in the I/O MOS area 60 and the high-speed MOS area 80, the increase of the thickness is substantially negligible due to the larger thickness of the first gate oxide film 13 with respect to the thickness of the second gate oxide film 15.

Figure 2D:
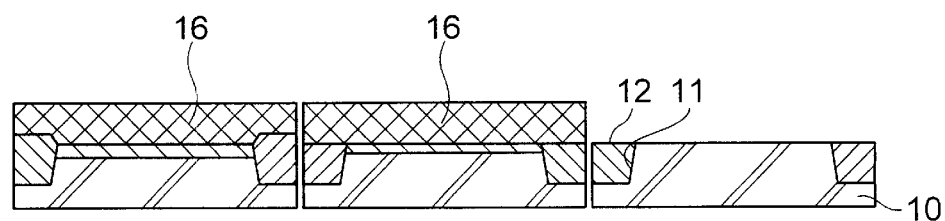

Subsequently, after covering the I/O MOS area 60 and the low-leakage MOS area 70 by a photoresist mask 16, second wet etching is performed to remove the first gate oxide film 13 in the high-speed MOS area 80, as shown in FIG. 2D. At this stage, the in-trench oxide film 12 in the high-speed MOS area 80 is slightly etched so that the top surface of the in-trench oxide film 12 becomes substantially flush with the top surface of the silicon substrate 10.

Figure 2E:
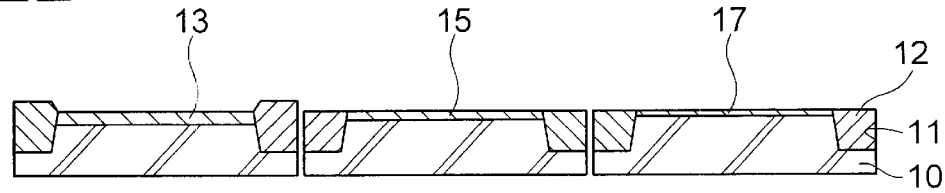

After removing the photoresist mask 16, third thermal oxidation is performed to form a 19-angstrom-thick third gate oxide film 17 in the high-speed MOS area 80, as shown in FIG. 2E. At this stage, although the thicknesses of the first gate oxide film 13 in the I/O MOS area 60 and the second gate oxide film 15 in the low-leakage MOS area 70 slightly increase, the increase is substantially negligible due to the larger thicknesses of the first and second gate oxide films 13 and 15 compared to the thickness of the third gate oxide film 17.

Figure 1K:
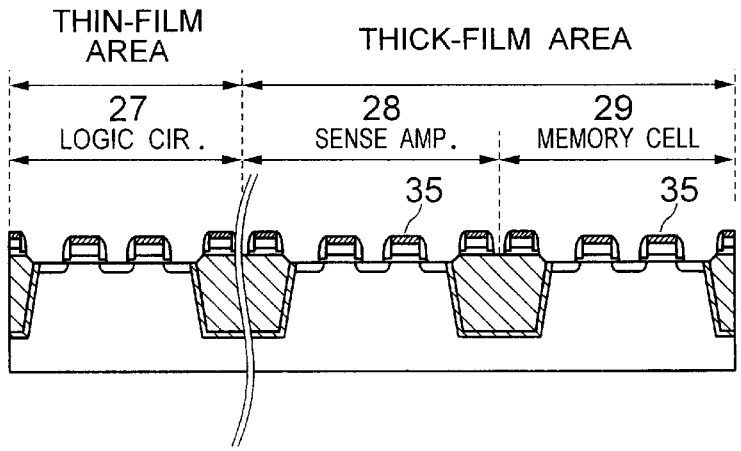

Thereafter, a step similar to the step described with reference to FIG. 1k is performed to form MOSFETs having the respective thicknesses of the gate oxide films, threby achieving a semiconductor device.

In the system LSI thus manufactured, the MOSFETs formed in the I/O MOS area 60 have, for example, a gate length of 0.35 micrometers, an operational voltage at 3.3 volts, and a thickness of 75 angstroms in the gate oxide film 13, as recited above. In addition, the MOSFETs formed in the low-leakage MOS area 70 have, for example, a gate length of 0.10 micrometers, an operational voltage at 1.2 volts, and a thickness of 26 angstroms in the gate oxide film 15, as recited above. Moreover, the MOSFETs formed in the high-speed MOS area 80 have, for example, a gate length of 0.10 micrometers, an operation voltage at 1.2 volts and a thickness of 19 angstroms in the gate oxide film 17, as recited above.

The I/O MOS area 60 is called buffer area and generally disposed as the peripheral area of the semiconductor chip of the system LSI for input/output of signals between the semiconductor chip and external circuits. The low-leakage MOS area 70 includes MOSFETs used in a standby logic circuit, for example, whereas the high-speed MOS area 80 includes MOSFETs used in a high-speed logic circuit.

In the manufacture of the semiconductor device as described above, since both the low-leakage MOS area 70 and the high-speed MOS area 80 are subjected to respective wet etching which removes the first gate oxide film 13 having the same thickness and accordingly continues for the same time length for both the areas 70 and 80, the oxide film 12 in the shallow trench 11 have the same thickness in both the areas 70 and 80 after the wet etching. In this respect, by arranging the top surface of the silicon oxide film 12 in the shallow trench 11 higher than the top surface of the silicon substrate 10 by a specified amount, the in-trench silicon oxide film 12 becomes substantially flush with the top surface of the silicon substrate 10 after the wet etching for the gate oxide films. This allows the wafer to have an even top surface substantially without irregularity, whereby a patterning accuracy can be improved after the photolithographic step. Thus, the off-leakage current and the variance in the ON-current of the MOSFETs can be reduced in the low-leakage MOS area 70 and the high-speed MOS area 80.

On the other hand, in the I/O MOS area 60, the in-trench silicon oxide film 12 in the shallow trench 11 protrudes from the top surface of the silicon substrate 10 by a specified amount in the final product. This provides a step difference at the boundary between the shallow trench 11 and the gate oxide film 13, which may cause degradation of the patterning accuracy in the gate length of the MOSFETs in the vicinity of the step difference. More specifically, the gate length of the MOSFETs in the vicinity of the step difference may be reduced by about 0.02 micrometers compared to the gate length of the MOSFETs in the other region. However, since the gate length of the MOSFETs in the I/O MOS area 60 is as large as 0.35 micrometers, the reduction of the gate length by 0.02 micrometers is not critical. On the other hand, since the gate length of the MOSFETs in the low-leakage MOS area 70 and the high-speed MOS area is around 0.10 micrometers, the variance of the gate length around 0.02 micrometers may significantly affect the transistor characteristics.

In the semiconductor device manufactured by the method of the above embodiment, the edge of the oxide film 12 in the shallow trench 11 is substantially free from the depression. Thus, an inter-channel leakage current or a reverse-narrow-channel characteristic in the MOSFETs, generally involved in the conventional semiconductor device having a STI structure, can be suppressed. It is understood that the reverse-narrow-channel characteristic is caused by the depression in the edge of the silicon oxide film in the shallow trench. More specifically, the depression tends to generate a concentration of the electric field in the channel region crossing the depression below the gage oxide film. The concentration of the electric field causes the inter-channel leakage current, which increases along with the reduction in the channel width of the MOSFETs thereby causing the reverse-narrow-channel characteristic.

In addition, the suppression of generation of the STI step at the boundary between the oxide film in the shallow trench and the gate oxide film allows an accurate patterning to be performed for the gate electrodes.

Further, the fabrication steps of the process can be simplified by the present embodiment. This results from the fact that the first gate oxide film is not removed in all the areas 60, 70 and 80. More specifically, the method of the present embodiment first forms the first gate oxide film 13 having a largest thickness, which is replaced by other gate oxide films 15 and 17 in the areas 70 and 80 other than the area 60 in which the MOSFETs have the first gate oxide film 13.

The process of the above embodiment, which does not use a silicon nitride film, allows the wet etching process using hot phosphoric acid to be unnecessary, thereby reducing the damage on the substrate surface. It is known that the wet etching process using the hot phosphoric acid has a tendency to damage the substrate surface as well as the gate oxide film.

In the above embodiment, the STI technique is exemplified wherein the shallow trench is filled with an in-trench oxide film 12. However, the material for filling the shallow trench is not limited to the silicon oxide film, and may be any material so long as at least the top portion of the insulating film filling the shallow trench can be removed during the etching of the gate oxide film formed on the substrate surface. Examples of such materials include silicon oxide film/silicon nitride film/silicon oxide film, which also causes a problem of the STI step at the boundary between the shallow trench and the substrate surface in the conventional technique.

In addition, the gate oxide film in the above embodiment may be replaced by a silicon oxide nitride film which is generally formed by thermal oxidation of silicon while introducing nitrogen onto the silicon surface.

By the configuration wherein the gate oxide films are consecutively formed by the three oxidation processes so that the gate oxide film having a largest thickness among the remaining gate oxide films is first formed in the above embodiment, the influence on the thickness (thicknesses) of the gate oxide film (films) formed during the preceding oxidation process (processes) can be alleviated in the current oxidation process.

In general, the thickness (Tox) of the silicon oxide film formed on a silicon surface is proportional to the square root of the time length (t) of the thermal oxidation performed on the silicon surface. For example, assuming that $t_{75}$ is the time length necessary for forming a 75-angstrom-thick gate oxide film in the I/O MOS area 60, the time lengths $t_{26}$ and $t_{19}$ necessary for forming 26-angstrom-thick and 19-angstrom-thickne gate oxide films, respectively, can be expressed by the following formulas:

$$t_{26} = t_{75}/(75/26)^2 = t_{75}/8.3,$$

and $$t_{19}=t_{26}/1.9=t_{75}/15.6.$$

It is understood from the above formulas that the influence on the thickness or thicknesses of the gate oxide film or films by the current oxidation process can be lowered in the present embodiment. In other word, by forming the gate oxide film having a largest thickness among the remaining gate oxide films, the conditions for the current oxidation process can be substantially arbitrarily set without affecting the thickness of the gate oxide film formed by the previous oxidation process.

In the above embodiment, the method of the present invention is directed to forming three gate oxide films having three different thicknesses. However, the present invention can be applied to forming any number of gate oxide films having different thicknesses. More specifically, assuming that the present invention is directed to forming n gate oxide films having n different thicknesses, the first gate oxide film having the largest thickness is first formed in all the areas, then the second gate oxide film having the second largest thickness is formed in a specified area after removing the first gate oxide film therein, then the third gate oxide film having the third largest thickness is formed in another specific area after removing the first gate oxide film therein, . . . and the last gate oxide film having the smallest thickness is formed in the last area after removing the first gate oxide film therein. The process for forming the n gate oxide films necessitates n-1 wet etching processes.

Since the above embodiments are described only for examples, the present invention is not limited to the above embodiments and various modifications or alterations can be easily made therefrom by those skilled in the art without departing from the scope of the present invention.

What is claimed is:

1. A method for fabricating a semiconductor device having thermal silicon oxide films having n different thicknesses, given n being an integer not smaller than three, said method comprising:

forming at least one isolation trench receiving therein an in-trench oxide film on a semiconductor substrate to separate an area of said semiconductor substrate into first through n-th circuit areas;

forming a first thermal oxide film having a largest thickness among said n different thicknesses in said first through n-th circuit areas; and iterating, consecutively for i=2 to i=n, removing said first thermal oxide film in said i-th circuit area and forming an i-th thermal oxide film having an i-th largest thickness among said n different thickness in said i-th circuit area.

2. The method as defined in claim 1, wherein said thermal silicon oxide films comprise gate insulating films of MOS-FETs.

3. The method as defined in claim 1, wherein said isolation trench forming forms said isolation trench so that said in-trench oxide film has a top surface higher than a top surface of said semiconductor substrate.

4. The method as defined in claim 1, wherein said first thermal silicon oxide film removing uses wet etching performed for a substantially same time length in said second to n-th circuit areas.

5. A method for fabricating a semiconductor device including gate oxide films having n different thicknesses, given n being an integer not smaller than three, said method comprising:

forming at least one isolation trench on a semiconductor substrate to separate an area of said semiconductor substrate into first through n-th circuit areas;

filling said at least one isolation trench with a filling member so that said filling member has a top surface higher than a top surface of said semiconductor substrate;

forming a first gate oxide film having a largest thickness among said n different thicknesses in said first through n-th circuit areas; and iterating, consecutively for i=2 to i=n, removing said first gate oxide film in said i-th circuit area and forming an i-th gate oxide film having an i-th largest thickness among said n different thicknesses in said i-th circuit area.

6. The method as defined in claim 5, wherein said first gate oxide film removing is performed until said top surface of said filling member becomes essentially flush with said top surface of said semiconductor substrate.

7. The method as defined in claim 5, wherein said gate oxide films comprise at least one of silicon oxide films and silicon oxide nitride films.

8. The method as defined in claim 5, wherein said filling member comprises at least one of a silicon oxide film and a layer structure including consecutively a silicon oxide film, a silicon nitride film and a silicon oxide film.

9. A method for fabricating a semiconductor device having thermal silicon oxide films with n different thicknesses, n being an integer not smaller than 2, said method comprising:

forming one or more isolation trenches on a semiconductor substrate to separate areas of said semiconductor substrate into first through n-th circuit areas;

filling said isolation trenches with a filling member so that said filling member has a top surface higher than a top surface of said semiconductor substrate;

forming a first gate oxide film having essentially a thickness corresponding to a largest thickness among said n different thicknesses in said first through n-th circuit areas;

forming a protective mask over said first through n-th circuit areas except for an i-th one of said n circuit areas, said i-th circuit area being a circuit area other than said first circuit area; and removing said first thermal oxide film in said i-th circuit area until said top surface of said filling member becomes essentially flush with said top surface of said semiconductor substrate.

10. The method of claim 9, further comprising:

forming an oxide layer in said i-th circuit area.

11. The method of claim 9, wherein said first circuit area comprises an area of an integrated circuit occupied by input/output elements of said integrated circuit.

12. The method of claim 9, wherein said i-th circuit area corresponds to an area having a thickness value second to said largest thickness, further comprising:

sequentially, based on decreasing thickness, removing said first thermal oxide film in said circuit area until said top surface of said filling member becomes essentially flush with said top surface of said semiconductor substrate and forming an oxide layer of a predetermined thickness.

* * * * *